United States Patent [19]
Brueck

[11] Patent Number: 5,563,735
[45] Date of Patent: Oct. 8, 1996

[54] PARALLEL ACTION ANGULAR ADJUSTMENT MECHANISM

[75] Inventor: Guenter Brueck, Midland, Canada

[73] Assignee: Hughes Electronics, Los Angeles, Calif.

[21] Appl. No.: 159,965

[22] Filed: Nov. 30, 1993

[51] Int. Cl.[6] .................................................. G02B 21/00
[52] U.S. Cl. ........................... 359/384; 359/368; 359/379
[58] Field of Search ...................................... 359/368, 372, 359/375, 379, 380, 382, 384, 404–409, 413–419, 429–430, 871–874, 876, 879, 896; 74/417 XY, 522

[56] References Cited

U.S. PATENT DOCUMENTS

| | | | |
|---|---|---|---|
| 2,439,526 | 4/1948 | Ott | 359/384 |
| 4,012,110 | 3/1977 | Schael et al. | 359/375 |
| 4,576,540 | 3/1986 | Westphal | 359/372 |
| 4,607,919 | 8/1986 | Gartner et al. | 359/368 |
| 4,725,125 | 2/1988 | Ellis et al. | 359/632 |
| 4,798,451 | 1/1989 | Fujiwara | 359/384 |
| 5,177,636 | 1/1993 | Furuhashi | 359/384 |

FOREIGN PATENT DOCUMENTS

| | | | |
|---|---|---|---|
| 2161291 | 1/1986 | United Kingdom | 359/379 |

*Primary Examiner*—Thong Nguyen
*Attorney, Agent, or Firm*—Michael W. Sales; Wanda K. Denson-Low

[57] ABSTRACT

An angular adjustment mechanism (11) for precisely adjusting an eyepiece (12) of an optical assembly (10) through the use of a parallel action joint lever system. The parallel action joint lever system acts to allow the eyepiece (12) and a mirror (24), disposed within the assembly (10), to rotate about a common axis (28), with the eyepiece (12) rotating at two times the angular speed of the mirror (24). The relative angular movement of the eyepiece (12) and the mirror (24) allows a user to obtain a comfortable viewing position without disturbing the alignment of the optical assembly (10). Furthermore, the relative angular movement of the eyepiece (12) and the mirror (24) does not effect the imaging of the optical assembly (10), or cause optical image shifts.

15 Claims, 4 Drawing Sheets

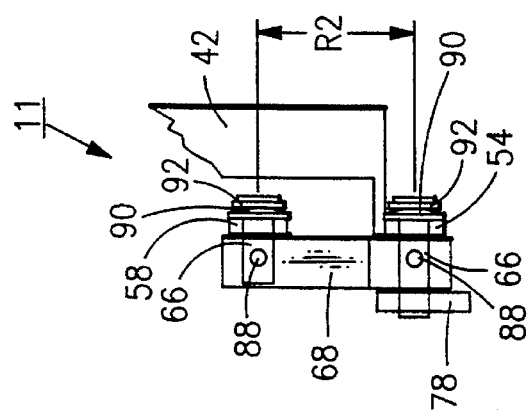
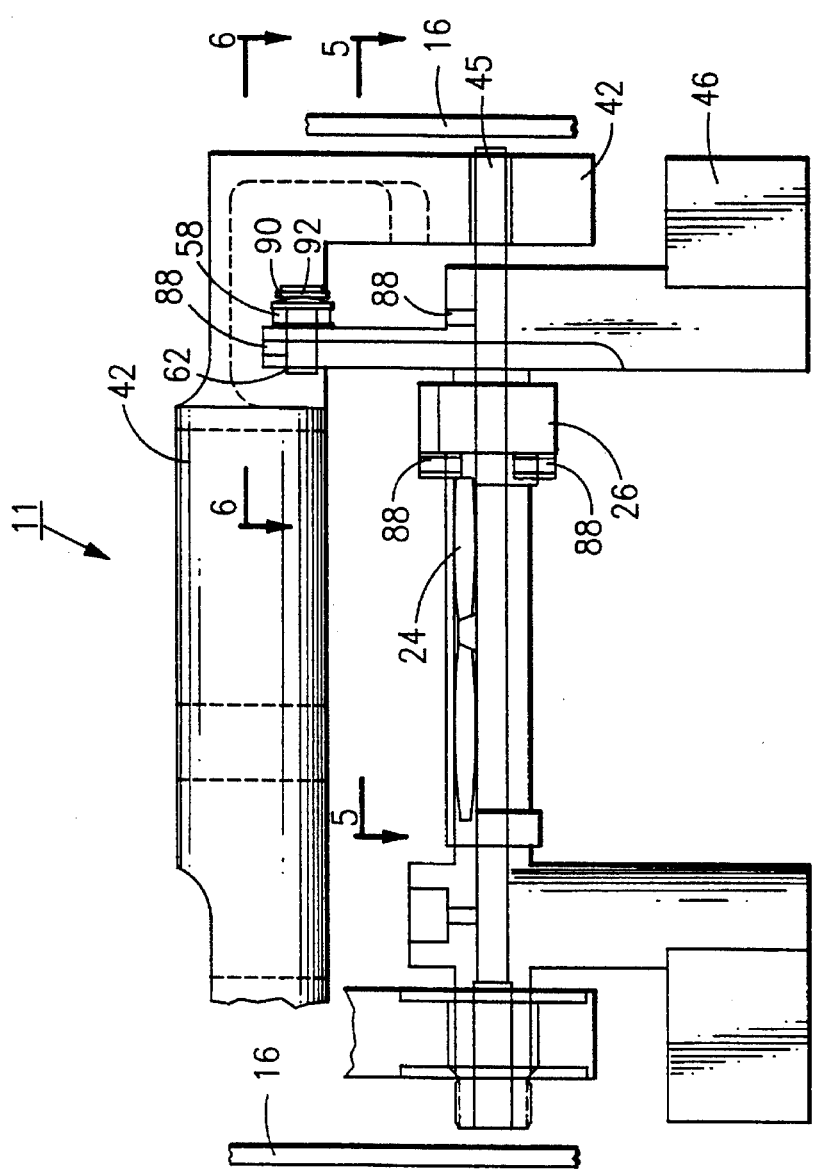

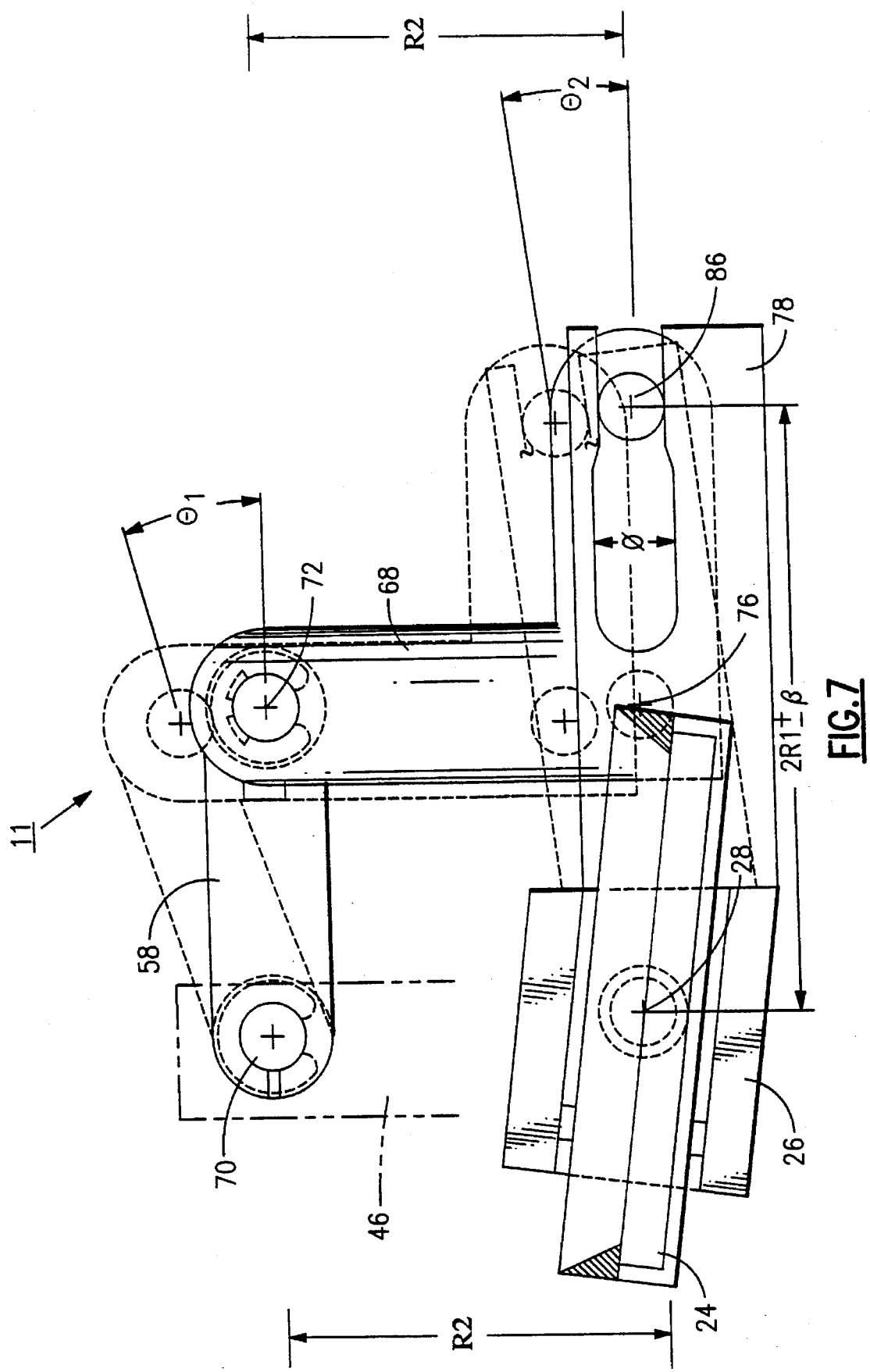

PARALLEL ACTION ANGULAR ADJUSTMENT MECHANISM

BACKGROUND OF THE INVENTION

The present invention generally relates to the adjustment of optical assemblies and, in particular, relates to a mechanism for rotating two optical assemblies about a common axis, one at twice the angular speed of the other, through the use of a parallel action joint lever system.

The use of microscopes, telescopes, and other optical assemblies is presently widespread and is expanding due to advances in optical technology. The users of such optical assemblies typically must spend a considerable amount of time peering through an eyepiece that is attached to the optical assembly. The position of the eyepiece with respect to the position of a particular user varies depending upon the type of optical assembly being used, the location where the optical assembly is situated, and the size of the particular user. To provide a user with a comfortable viewing position, many optical assemblies are comprised of some sort of means for adjusting the position of the eyepiece with respect to the position of the user.

To date, the position of an eyepiece of an optical assembly has typically been adjusted through the use of a series of gears. Such gears are rotatably mounted to the optical assembly so as to allow the eyepiece to move in a precise manner with respect to the rest of the optical assembly. These gears must be accurately machined and fitted so as to allow such precise eyepiece movement without significantly affecting the imaging of the optical assembly, or causing optical image shifts. The machining and fitting processes are painstakingly tedious and, even when considerable care is given to these processes, backlash problems can still occur if the gears become loosely engaged due to any depreciative effects on the gear teeth over time or due to debris becoming caught between the gear teeth.

To overcome the above-mentioned shortcomings associated with using a series of gears to adjust the position of an eyepiece of an optical assembly, emphasis must be placed on manufacturing a suitable replacement at low cost. Otherwise, a high cost solution to overcome the above-mentioned shortcomings would reap no benefits in a competitive marketplace. It would therefore be desirable to overcome the shortcomings of the above-mentioned prior art adjustment means, while providing a simple, low cost mechanism for precisely adjusting the eyepiece of an optical assembly without causing optical image shifts.

SUMMARY OF THE INVENTION

The present invention contemplates a simple, low cost mechanism for precisely adjusting an eyepiece of an optical assembly through the use of a parallel action joint lever system. The parallel action joint lever system acts to allow the eyepiece and a mirror, disposed within the assembly, to rotate about a common axis, with the eyepiece rotating at two times the angular speed of the mirror. The relative angular movement of the eyepiece and the mirror allows a user to obtain a comfortable viewing position without disturbing the alignment of the optical assembly. Furthermore, the relative angular movement of the eyepiece and the mirror does not effect the imaging of the optical assembly, or cause optical image shifts.

From the above descriptive summary, it is apparent how the present invention parallel action angular adjustment mechanism overcomes the shortcomings of the above-mentioned prior art.

Accordingly, it is one objective of the present invention is to provide a simple, low cost mechanism for precisely adjusting an eyepiece of an optical assembly using a parallel action joint lever system such that there is no effect on the imaging of the optical assembly, or optical image shifts. This object is accomplished, at least in part, by a mechanism employing a parallel action joint lever system.

Other objectives and advantages of the present invention will become apparent to those skilled in the art from the following derailed description read in conjunction with the appended claims and the drawings which are appended hereto.

BRIEF DESCRIPTION OF THE DRAWINGS

In order to facilitate a fuller understanding of the present invention, reference is now made to the appended drawings. These drawings, not drawn to scale, should not be construed as limiting the present invention, but are intended to be exemplary only.

FIG. 3 is a partial cross-sectional full end view of the ophthalmoscope binocular and the present invention parallel action angular adjustment mechanism shown in FIG. 1, taken along line 3—3 of FIG. 1;

FIG. 4 is a partial cross-sectional isolated end view of the present invention parallel action angular adjustment mechanism shown in FIG. 1, taken along line 4—4 of FIG. 1;

FIG. 7 is a isolated side view of the present invention parallel action angular adjustment mechanism shown in FIG. 1.

DETAILED DESCRIPTION OF THE INVENTION

Figure 1:
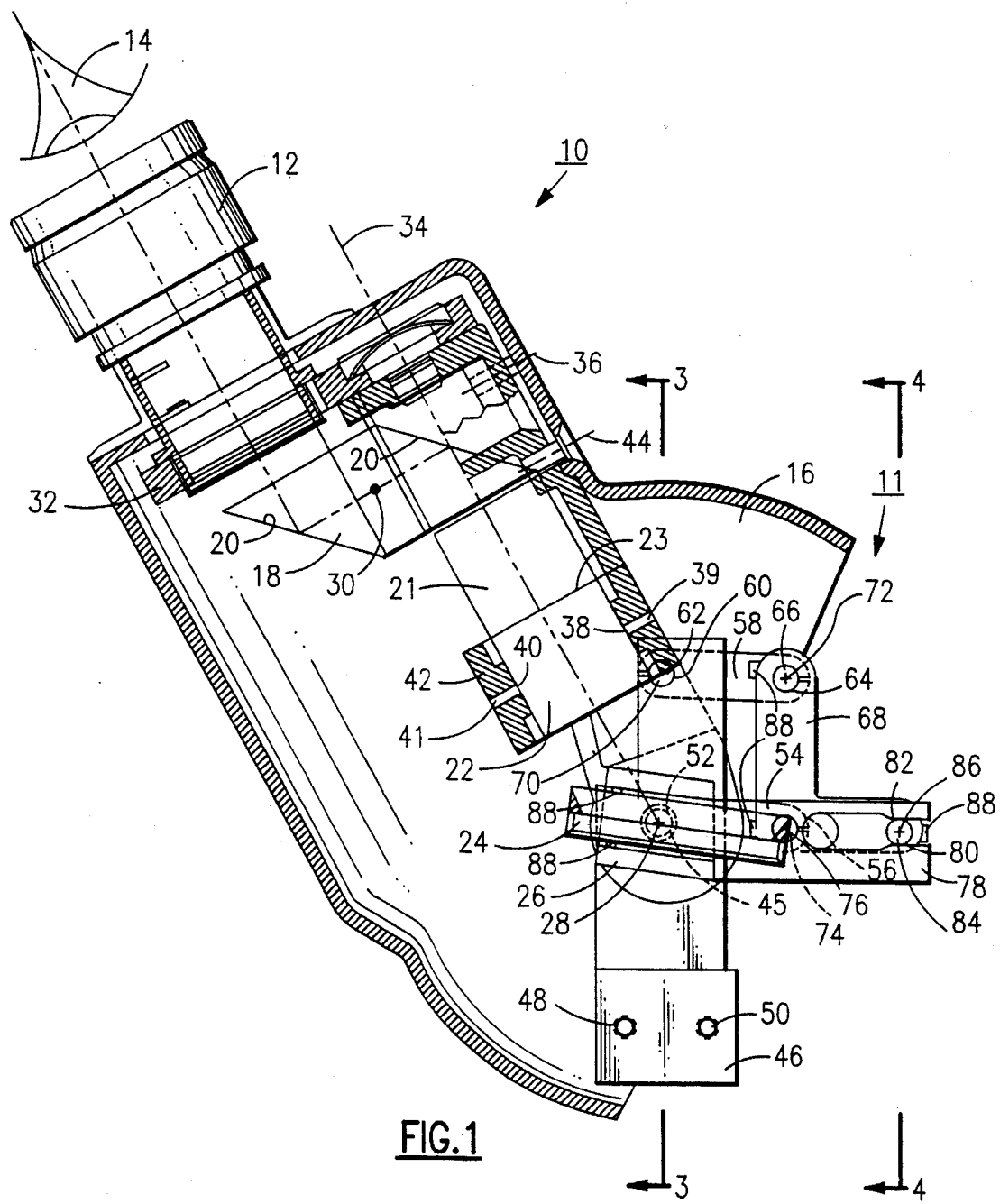
FIG. 1 is a partial cross-sectional side view of a binocular of an ophthalmoscope that is adjustable by way of a parallel action angular adjustment mechanism according to the present invention.

Referring to FIG. 1, there is shown an assembly 10 of a binocular of an ophthalmoscope that is adjustable by way of a parallel action angular adjustment mechanism 11 according to the present invention. The assembly 10 is first comprised of an eyepiece 12 through which a user 14 peers through. The eyepiece 12 is attached to a first prism frame 32 that contains a first prism 18, with reflecting surfaces 20, a second prism 21, and a third prism 22 for creating an optical path between the eyepiece 12, or the user 14, and a mirror 24. The mirror 24 is mounted to a mirror mount 26 that in turn is attached to a shaft 45 so as to be rotatable about a first axis 28. Thus, the minor mount 26 and the mirror 24 are both rotatable about the first axis 28 at a first common angular speed.

The first prism 18 is secured to a first prism frame 32, a portion of which is rotatable along axis 34 so as to allow the eyepiece 12 to be adjusted without disturbing the optical path between the eyepiece 12, or the user 14, and the minor 24. The first prism 18 is secured to the first prism frame 32 with an adhesive that is applied to two sides (only one side shown) of the first prism at point 30. The first prism frame 32 is secured to the second prism frame 42 with a shaft screw at axis 34. The second prism 21 is secured to the third prism 22 with an adhesive that is applied at their interface 23. The third prism 22 is secured to a second prism frame 42 that is rotatable about the first axis 28. The third prism 22 is secured to the second prism frame 42 with an adhesive that is applied to two sides of the third prism 22 at points 38 and 40. The adhesive for securing the third prism 22 is applied through two corresponding ports 39 and 41 formed within the second prism frame 42. The second prism frame 42 is secured to the shaft 45 at axis 28. The housing 16 is attached to the frame 42 with, for example, a pair of flathead screws at locations 36 and 44. Thus, the first prism frame 32, the first prism 18, the second prism frame 42, the second prism 21, the third prism 22, the housing 16, and the eyepiece 12 are all rotatable about the first axis 28 at a second common angular speed. It should be noted that the first axis 28 is maintained by the shaft 45 that protrudes from a support 46 which is secured to a main frame of an ophthalmoscope (not shown) with a pair of bolts (not shown) at points 48 and 50.

The assembly 10 as described so far is a typical ophthalmoscope binocular assembly. This typical ophthalmoscope binocular assembly is enhanced with the addition of the parallel action angular adjustment mechanism 11, as will now be described.

Figure 2:
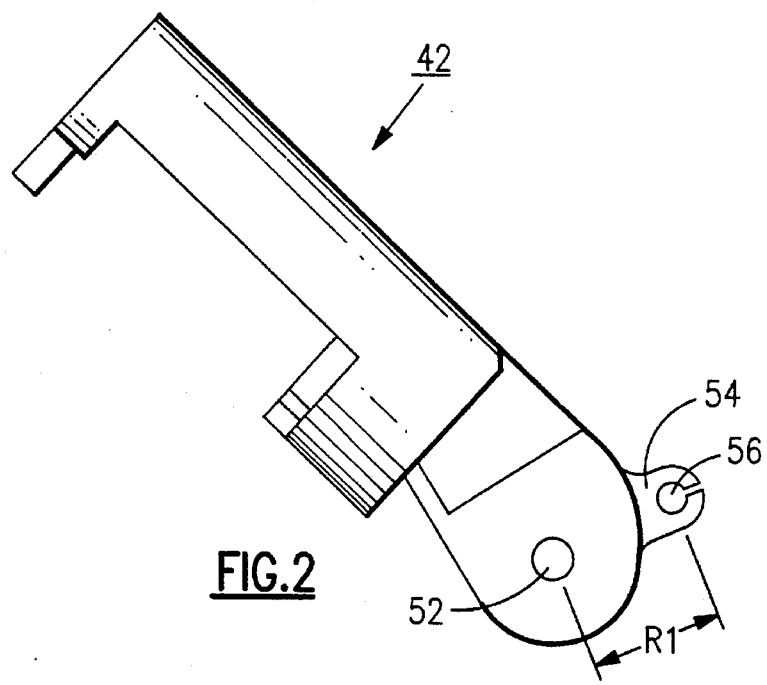
FIG. 2 is an isolated side view of the binocular prism frame shown in FIG. 1 with a first lever integrated therein.

Referring to FIG. 2, the second prism frame 42 is shown having an aperture 52 for accepting shaft 45 so as to permit its rotation about the first axis 28. The second prism frame 42 also has a first lever 54 integrated therein. This first lever 54 is equipped with a circular pivot region 56, the center of which is at a radial distance, $R_1$, from the center of the aperture 52, as shown.

Referring back to FIG. 1, a second lever 58 is shown having a circular pivot region 60 on one end for accepting a pin 62 protruding from the support 46, and a circular pivot region 64 on the other end for accepting a pin 66 protruding from a third lever 68 having an "L" shape. Since the support 46, and thus the pin 62, are stationary, the second lever 58 is rotatable about a second axis 70. On the other hand, the third lever 68, and thus the pin 66, are not stationary. Thus, the second lever 58 and the third lever 68 are relatively rotatable about a third axis 72. The circular pivot region 56 of the first lever 54 accepts a pin 74 also protruding from the third lever 68. Similar to the second lever 58, the first lever 54 and the third lever 68 are relatively rotatable about a fourth axis 76. It should be noted that the distance between the center of aperture 52 and the center of circular pivot region 60, or the center of shaft 45 and the center of pin 62, or the first axis 28 and the second axis 70, is equal to $R_2$. It should also be noted that the distance between the center of circular pivot region 60 and the center of circular pivot region 64, or the center of pin 62 and the center of pin 66, or the second axis 70 and the third axis 72, is equal to $R_1$. It should further be noted that the distance between the center of circular pivot region 64 and the center of circular pivot region 56, or the center of pin 66 and the center of pin 74, or the third axis 72 and the fourth axis 76, is equal to $R_2$.

Integrated into the mirror mount 26 is a fourth lever 78 which, like the mirror mount 26 itself, is rotatable about the first axis 28. The fourth lever 78 has an upper guide surface 82 and a lower guide surface 80 formed therein for accepting a pin 84 protruding from the third lever 68 therebetween. The upper guide surface 82 is spring loaded against pin 84 such that the pin 84 is always held firmly in place between the upper guide surface 82 and the lower guide surface 80, while still allowing the pin 84 to slide along between the upper guide surface 82 and the lower guide surface 80 when an appropriate force is applied thereto. Neither the fourth lever 78, and thus the upper 82 and lower 80 guide surfaces, or the third lever 68, and thus pin 84, are stationary. Thus, the fourth lever 78 and the third lever 68 are relatively rotatable about a fifth axis 86. It should be noted that the upper guide surface 82 and the lower guide surface 80 are initially formed parallel to a straight line drawn between the first axis 28 and the fifth axis 86. It should also be noted that the distance between the center of pivot region 56 and the center of pin 84, or the center of pin 74 and the center of pin 84, or the fourth axis 76 and the fifth axis 86, is equal to $R_1$. The mirror 26, the shaft 45, and pins 62, 66, 74, and 84 are all held in place with captivating screws 88.

Figure 5:
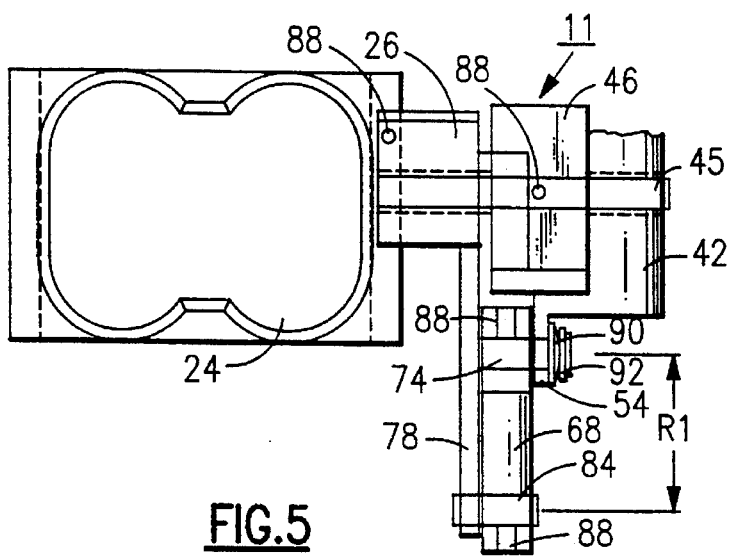
FIG. 5 is a partial cross-sectional full top view of the ophthalmoscope binocular and the present invention parallel action angular adjustment mechanism shown in FIG. 1, taken along line 5—5 of FIG. 3.
Figure 6:
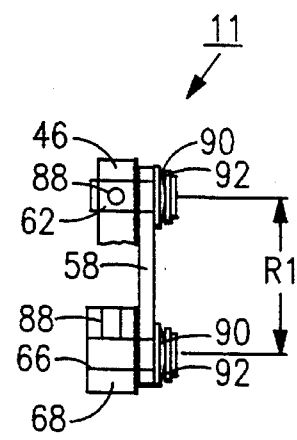
FIG. 6 is a partial cross-sectional isolated top view of the present invention parallel action angular adjustment mechanism shown in FIG. 1, taken along line 6—6 of FIG. 3.

Referring to FIG. 3, a partial cross-sectional full end view of the parallel action angular adjustment mechanism 11 is shown. Referring to FIG. 4, a partial cross-sectional isolated end view of the parallel action angular adjustment mechanism 11 is shown. The pins 62, 66, and 74 are all held within the circular pivot regions 60, 64, and 56, respectively, with washers 90 and C-rings 92. Preferably, one of the washers 90 is curved and, upon being tightened, provides a spring loading effect to reduce play between the rotating parts. Referring to FIG. 5, a partial cross-sectional full top view of the parallel action angular adjustment mechanism 11 is shown. Referring to FIG. 6, a partial cross-sectional isolated top view of the parallel action angular adjustment mechanism 11 is shown.

Referring to FIG. 7, the parallel action angular adjustment mechanism 11 is shown in its two extreme angular positions. Also shown in FIG. 7 are typical dimensions of the fourth lever 78, along with a typical material (brass, 66% hard) and the resulting forces of the upper guide surface 82 against pin 84 for these dimensions and material. In the ideal case, the angular position of the binocular assembly, or the eyepiece 12, is defined as $\theta_1$, and the ideal angular position of the mirror 24 is defined as $\theta_2$, wherein, $$\theta_2 = \frac{\theta_1}{2} = \arctan \frac{\sin\theta_1}{\cos\theta_1 + 1}$$

At $\theta_1=0°$, the distance between the first axis 28 and the fifth axis 86 is equal to $2R_1$. However, when $\theta_1$ varies over its range of motion, which is typically ±15°, the length between the first axis 28 and the fifth axis 86 varies by an amount, $\beta$, which can be expressed by the following equation, $$\beta = 2R_1 \frac{R_1(\cos\theta_1 + 1)}{\cos\theta_2}$$

This variation in the distance between the first axis 28 and the fifth axis 86 does not affect the angular position of the mirror 24 with respect to the angular position of the binocular assembly, or the eyepiece 12. However, taking into consideration a diametric axial tolerance of 0.05 mm, a deviation in the ideal angular position of the mirror 24 with respect to the angular position of the binocular assembly, or the eyepiece 12, does occur. This deviation is small, however, since when the binocular assembly, or the eyepiece 12, is in its two extreme position angular positions, which is typically $\theta_1=15°$, the deviation of the angular position of the mirror 24 would only be ±0.17 mrad, causing an optical image shift of only ±0.17 mm. At this point it should be noted that all of the levers 54, 58, 68, and 78, may be fabricated from many different types of material, but rigid metals such as brass, aluminum and steel are preferred.

With the preferred embodiment of the present invention parallel action angular adjustment mechanism 11 now fully described it can thus be seen that the primary objective set forth above is efficiently attained and, since it will be understood that other arrangements and configurations may be made in the above described mechanism 11 without departing from the spirit and scope of the invention, it is intended that all matter contained in the above description or shown in the accompanying drawings shall be interpreted as illustrative and not in a limiting sense. Hence, the present invention is deemed limited only by the claims appended hereto and the reasonable interpretation thereof.

What is claimed is:

1. A mechanism for precisely adjusting an eyepiece of an optical assembly by allowing said optical assembly and a mirror assembly, disposed within said optical assembly, to rotate about a common axis with said optical assembly, said mechanism comprising:

an optical assembly having an eyepiece for viewing an optical image therethrough, a first pivotal engagement means and a second pivotal engagement means separated by a first operative length, said first pivotal engagement means having a center defining a first axis, said second pivotal engagement means having a center defining a second axis;

a mirror assembly disposed within said optical assembly for reflecting said viewed image;

a first lever fixedly integrated into said optical assembly having a third pivotal engagement means and a fourth pivotal engagement means separated by a second operative length, said third pivotal engagement means operatively engaged with said first pivotal engagement means for rotating said optical assembly about said first axis, said fourth pivotal engagement means having a center defining a third axis;

a second lever having a fifth pivotal engagement means and a sixth pivotal engagement means separated by said second operative length, said fifth pivotal engagement means operatively engaged with said second pivotal engagement means for providing rotation about said second axis, said sixth pivotal engagement means having a center defining a fourth axis;

a third lever having a seventh pivotal engagement means, an eight pivotal engagement means separated from said seventh pivotal engagement means by said first operative length, and a ninth pivotal engagement means separated from said eighth pivotal engagement means by said second operative length, said seventh pivotal engagement means, said eighth pivotal engagement means, and said ninth pivotal engagement means positioned so as to form a right triangle with said eighth pivotal engagement means at a right angle vertex, said seventh pivotal engagement means operatively engaged with said sixth pivotal engagement means for providing rotation about said fourth axis, said eighth pivotal engagement means operatively engaged with said fourth pivotal engagement means for providing rotation about said third axis, said ninth pivotal engagement means having a center defining a fifth axis;

a fourth lever fixedly integrated into said mirror assembly having a tenth pivotal engagement means and an eleventh pivotal engagement means, said tenth pivotal engagement means operatively engaged with said first pivotal engagement means for rotating said mirror assembly about said first axis, said eleventh pivotal engagement means having at least one guide surface formed therein operatively engaged with said ninth pivotal engagement means for providing rotation about said fifth axis, such that a rotation of said optical assembly about said first axis at a first angular speed results in a rotation of said mirror assembly about said first axis at a second angular speed without causing optical image shifts viewable at said eyepiece, wherein said first angular speed is twice said second angular speed.

2. The mechanism as defined in claim 1, wherein said first pivotal engagement means is a cylindrical shaft, and said second pivotal engagement means is a cylindrical pin.

3. The mechanism as defined in claim 2, wherein said cylindrical shaft and said cylindrical pin are both held in place with captivating screws.

4. The mechanism as defined in claim 3, wherein said optical assembly is a binocular assembly of an ophthalmoscope.

5. The mechanism as defined in claim 1, wherein said mirror assembly is comprised of:

a mirror; and a mirror mount for securing said mirror thereto.

6. The mechanism as defined in claim 1, wherein said first lever is integrated into a prism frame which is fixedly secured to said optical assembly.

7. The mechanism as defined in claim 6, wherein said third pivotal engagement means is a circular aperture formed in said prism frame, and said fourth pivotal engagement means is a circular pivot region.

8. The mechanism as defined in claim 1, wherein said fifth pivotal engagement means is a circular pivot region, and said sixth pivotal engagement means is a circular pivot region.

9. The mechanism as defined in claim 1, wherein said seventh pivotal engagement means, said eighth pivotal engagement means, and said ninth pivotal engagement means are all cylindrical pins.

10. The mechanism as defined in claim 9, wherein all of said cylindrical pins are held in place with captivating screws.

11. The mechanism as defined in claim 1, wherein said tenth pivotal engagement means is a means for attaching said mirror assembly to said first pivotal engagement means.

12. The mechanism as defined in claim 11, wherein said means for attaching said mirror assembly to said first engagement means is at least one captivating screw.

13. The mechanism as defined in claim 12, wherein said at least one guide surface is comprised of an upper guide surface and the lower guide surface initially formed parallel to a straight line drawn between said first axis and said fifth axis.

14. The mechanism as defined in claim 13, wherein said upper guide surface is spring loaded against said ninth pivotal engagement means.

15. An optical apparatus comprising:

an optical assembly having an eyepiece for viewing an optical image there through;

a mirror assembly disposed within said optical assembly for reflecting said viewed image; and four parallel action lever means rotably connected together, said lever means for operating said optical assembly such that rotation of said optical assembly about a first axis at a first angular speed results in a rotation of said mirror assembly about said first axis at a second angular speed without causing optical image shifts viewable at said eyepiece, wherein said first angular speed is twice said second angular speed.

\* \* \* \* \*